(12) United States Patent
He et al.

(10) Patent No.: US 11,658,167 B2
(45) Date of Patent: May 23, 2023

(54) DISPLAY PANEL AND DISPLAY DEVICE

(71) Applicant: Shanghai Tianma Micro-Electronics Co., Ltd., Shanghai (CN)

(72) Inventors: Zeshang He, Shanghai (CN); Shaorong Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 61 days.

(21) Appl. No.: 16/728,940

(22) Filed: Dec. 27, 2019

(65) Prior Publication Data

US 2020/0312831 A1 Oct. 1, 2020

(30) Foreign Application Priority Data

Mar. 29, 2019 (CN) .......................... 201910251996.6

(51) Int. Cl.
*H01L 25/18* (2023.01)
*H01L 27/12* (2006.01)

(52) U.S. Cl.
CPC ............ *H01L 25/18* (2013.01); *H01L 27/124* (2013.01); *H01L 27/1255* (2013.01)

(58) Field of Classification Search
CPC .... H01L 25/18; H01L 27/124; H01L 27/1255
USPC .......................................................... 257/71
See application file for complete search history.

(56) References Cited

U.S. PATENT DOCUMENTS

| | | | |
|---|---|---|---|
| 6,330,044 B1* | 12/2001 | Murade ............. | G02F 1/133512 349/44 |
| 9,691,793 B2* | 6/2017 | Ma ........................ | H01L 27/124 |
| 10,290,658 B2* | 5/2019 | Koo ..................... | H01L 27/1251 |
| 10,620,494 B2* | 4/2020 | Oikawa ............. | G02F 1/136286 |
| 2018/0053032 A1* | 2/2018 | Ding ..................... | G06K 9/0004 |
| 2020/0286927 A1* | 9/2020 | Park .................. | H01L 29/41733 |

FOREIGN PATENT DOCUMENTS

| | | |
|---|---|---|
| CN | 106876552 A | 6/2017 |
| CN | 107104152 A | 8/2017 |
| CN | 107705713 A | 2/2018 |
| CN | 109148489 A | 1/2019 |

OTHER PUBLICATIONS

Office Action for related Chinese Application No. 201910251996.6; report dated Aug. 21, 2020.

* cited by examiner

*Primary Examiner* — Ori Nadav
(74) *Attorney, Agent, or Firm* — von Briesen & Roper, s.c.

(57) ABSTRACT

Provided are a display panel and a display device. The display panel includes a substrate and a plurality of pixel units disposed on the substrate. Each pixel unit includes a driving circuit and a light-emitting component, the driving circuit is disposed between the substrate and the light-emitting component, and the driving circuit is used for driving a corresponding light-emitting component to emit light. At least one light-emitting component is a micro Light Emitting Diode (LED). For a pixel unit in which the light-emitting component is the micro LED, the driving circuit at least includes a first thin film transistor, and a source and a drain of the first thin film transistor are disposed in a source-drain layer. A first electrode of the micro LED is electrically connected to a source or a drain of a corresponding first thin film transistor.

15 Claims, 10 Drawing Sheets

DISPLAY PANEL AND DISPLAY DEVICE

CROSS-REFERENCES TO RELATED APPLICATIONS

This application claims priority to Chinese patent application No. CN201910251996.6 filed on Mar. 29, 2019, the disclosure of which is incorporated herein by reference in its entirety.

TECHNICAL FIELD

Embodiments of the present disclosure relate to the field of display technologies, in particular, to a display panel and a display device.

BACKGROUND

With the development of display technologies, a micro light-emitting diode (micro LED) has been gradually applied in the display field because of its small size, high light-emitting efficiency and low energy consumption. For example, in order to solve the problem that the area of a display region of a display panel is reduced due to a need to provide a hollowed-out region in the middle of an upper end of a display screen of a mobile phone for disposing an optical electronic component such as a front-facing camera for a current full-screen smartphone in the hollowed-out region, the micro LED may be used in the region of the display panel where the optical electronic component is disposed for implementing high-transmittance display by using the characteristic that the micro LED is much smaller in size than the organic light-emitting component.

For the display panel integrated with the micro LED, the present manufacturing method of the display panel is to bind the micro LED directly to an array substrate provided with the driving circuit. However, the defects existing in the chip material of the micro LED will rapidly proliferate and multiply when the temperature is high, resulting in defects invading a light-emitting layer of the micro LED to form a large number of non-radiative recombination centers, so that the light-emitting efficiency of the micro LED is reduced, the service life of the micro LED is reduced, and the higher the temperature is, the shorter the service life of the micro LED is, which affects the service life of the display panel.

SUMMARY

In view of the above, the present disclosure provides a display panel and a display device, which effectively reduces a temperature of a micro LED, thereby improving the problems that a light-emitting efficiency of the micro LED is reduced and that a service life of the micro LED is reduced since defects of the micro LED caused by an increase in the temperature invade the light-emitting layer of a micro LED.

In a first aspect, embodiments of the present disclosure provide a display panel.

The display panel includes: a substrate and a plurality of pixel units disposed on the substrate, where each of the plurality of pixel units includes a driving circuit and a light-emitting component, and the driving circuit is disposed between the substrate and the light-emitting component, and the driving circuit is configured for driving a corresponding light-emitting component to emit light.

At least one light-emitting component is a micro LED.

For a pixel unit in which the light-emitting component is the micro LED, the driving circuit at least includes a first thin film transistor, a source and a drain of the first thin film transistor are disposed in a source-drain layer, and a first electrode of the micro LED is electrically connected to a source or a drain of a corresponding first thin film transistor.

The pixel unit in which the light-emitting component is the micro LED further includes a metal structure, the metal structure is disposed between the substrate and the source-drain layer, and the source or the drain of the first thin film transistor electrically connected to the first electrode of the micro LED is electrically connected to the metal structure.

In a second aspect, embodiments of the present disclosure further provide a display device including the display panel described in the first aspect.

Embodiments of the present disclosure provide a display panel and a display device. The display panel includes a substrate and a plurality of pixel units disposed on the substrate, each pixel unit includes a driving circuit and a light-emitting component. The driving circuit is disposed between the substrate and the light-emitting component, and the driving circuit is configured for driving the corresponding light-emitting component to emit light. At least one light-emitting component is a micro LED, and for the pixel unit in which the light-emitting component is the micro LED, the driving circuit at least includes a first thin film transistor, and the source and the drain of the first thin film transistor are disposed in a source-drain layer. A first electrode of the micro LED is electrically connected to the source or the drain of the corresponding first thin film transistor. The pixel unit in which the light-emitting component is the micro LED further includes a metal structure, the metal structure is disposed between the substrate and the source-drain layer, and the source or the drain of the first thin film transistor electrically connected to the first electrode of the micro LED is electrically connected to the metal structure. In this way, the source or the drain of the first thin film transistor electrically connected to the first electrode of the micro LED and the metal structure electrically connected to the first electrode of the micro LED are used as a heat dissipation structure of the micro LED so that a temperature of the micro LED is effectively reduced, thereby improving the problem that the light-emitting efficiency of the micro LED is reduced and that a service life of the micro LED is reduced since defects of the micro LED caused by an increase in temperature invade the light-emitting layer of the micro LED.

BRIEF DESCRIPTION OF DRAWINGS

Other features, purposes and advantages of the present application will become more apparent after a detailed description of non-restrictive embodiments with reference to the drawings is read.

DETAILED DESCRIPTION

Figure 1:
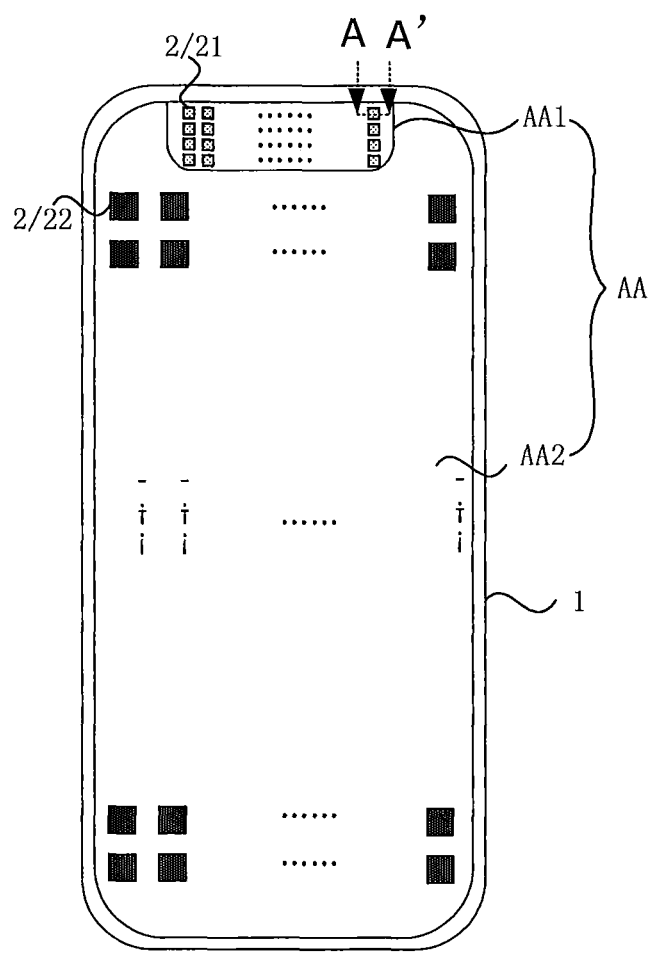
FIG. 1 is a top view of a display panel according to an embodiment of the present disclosure.

Hereinafter the present disclosure will be further described in detail in conjunction with the drawings and embodiments. It is to be understood that the specific embodiments set forth below are intended to illustrate and not to limit the present disclosure. Additionally, it is to be noted that, for ease of description, only part, not all, of the structures related to the present disclosure are illustrated in the drawings. Throughout this specification, same or similar labels in the drawings denote same or similar structures, components or processes. It is to be noted that if not in collision, the embodiments and features therein in the present application may be combined with each other.

Embodiments of the present disclosure provide a display panel. The display panel includes a substrate and a plurality of pixel units disposed on the substrate, and each pixel unit includes a driving circuit and a light-emitting component. The driving circuit is disposed between the substrate and the light-emitting component, and the driving circuit is configured for driving a corresponding light-emitting component to emit light. At least one light-emitting component is a micro LED. For a pixel unit in which the light-emitting component is the micro LED, the driving circuit at least includes a first thin film transistor, a source and a drain of the first thin film transistor are disposed in a source-drain layer, and a first electrode of the micro LED is electrically connected to a source or a drain of a corresponding first thin film transistor. The pixel unit in which the light-emitting component is the micro LED further includes a metal structure, the metal structure is disposed between the substrate and the source-drain layer, and the source or the drain of the first thin film transistor electrically connected to the first electrode of the micro LED is electrically connected to the metal structure.

With the development of display technologies, a micro light-emitting diode (micro LED) has been gradually applied in the display field because of its small size, high light-emitting efficiency and low energy consumption. For example, in order to solve the problem that the area of a display region of a display panel is reduced due to a need to provide a hollowed-out region in the middle of an upper end of a display screen of a mobile phone for disposing an optical electronic component such as a front-facing camera for a current full-screen smartphone in the hollowed-out region, the micro LED may be used in the region of the display panel where the optical electronic component is disposed for implementing high-transmittance display by using the characteristic that the micro LED is much smaller in size than the organic light-emitting component. For the display panel integrated with the micro LED, the present manufacturing method of the display panel is to bind the micro LED directly to an array substrate provided with the driving circuit. However, defects existing in the chip material of the micro LED will rapidly proliferate and multiply when the temperature is high, resulting in the defects invading a light-emitting layer of the micro LED to form a large number of non-radiative recombination centers, so that the light-emitting efficiency of the micro LED is reduced, the service life of the micro LED is reduced, and the higher the temperature is, the shorter the service life of the micro LED is, which affects the service life of the display panel.

Embodiments of the present disclosure provide a display panel, the display panel includes a substrate and a plurality of pixel units disposed on the substrate, and each pixel unit includes a driving circuit and a light-emitting component. The driving circuit is disposed between the substrate and the light-emitting component, and the driving circuit is used for driving the corresponding light-emitting component to emit light. At least one light-emitting component is the micro LED. For the pixel unit in which the light-emitting component is the micro LED, the driving circuit at least includes a first thin film transistor, the source and the drain of the first thin film transistor being disposed in a source-drain layer. A first electrode of the micro LED is electrically connected to the source or the drain of the corresponding first thin film transistor. The pixel unit in which the light-emitting component is the micro LED further includes a metal structure, the metal structure is disposed between the substrate and the source-drain layer, and the source or the drain of the first thin film transistor electrically connected to the first electrode of the micro LED is electrically connected to the metal structure. In this way, the source or the drain of the first thin film transistor electrically connected to the first electrode of the micro LED and the metal structure electrically connected to the first electrode of the micro LED are used as a heat dissipation structure of the micro LED so that a temperature of the micro LED is effectively reduced, thereby improving the problem that the light-emitting efficiency of the micro LED is reduced and that a service life of the micro LED is reduced since defects of the micro LED caused by an increase in temperature invade the light-emitting layer of the micro LED.

The above is a core idea of the present disclosure, and technical solutions in the embodiments of the present disclosure will be described clearly and completely in conjunction with drawings in the embodiments of the present disclosure. Based on the embodiments of the present disclosure, all other embodiments obtained by those skilled in the art without making creative work are within the scope of the present disclosure.

Figure 2:
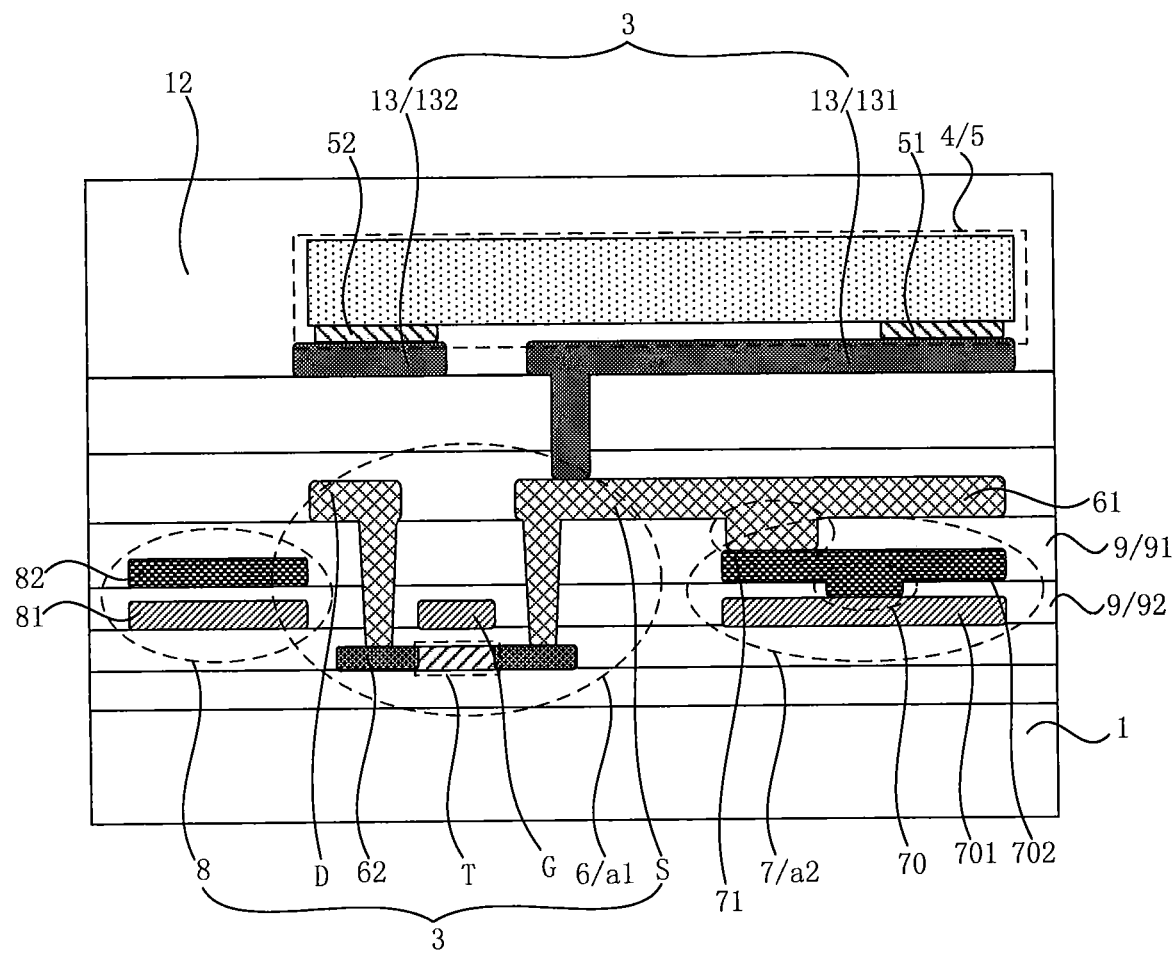
FIG. 2 is a cross-sectional view of the display panel shown in FIG. 1 along a section line A-A'.

FIG. 1 is a top view of a display panel according to an embodiment of the present disclosure, and FIG. 2 is a cross-sectional view of the display panel shown in FIG. 1 along a section line A-A'. Combining with FIGS. 1 and 2, the display panel includes a substrate 1 and a plurality of pixel units 2 disposed on the substrate 1, and each pixel unit 2 includes a driving circuit 3 and a light-emitting component 4, the driving circuit 3 is disposed between the substrate 1 and the light-emitting component 4, and the driving circuit 3 is configured for driving a corresponding light-emitting component 4 to emit light.

At least one light-emitting component 4 in the display panel is a micro LED 5 in the display panel. For the pixel unit 2 in which the light-emitting component 4 is the micro LED 5, the driving circuit 3 at least includes a first thin film transistor 6, a source S and a drain D of the first thin film transistor 6 are disposed in a source-drain layer 61, and a first electrode 51 of the micro LED 5 is electrically connected to a source S or a drain D of a corresponding first thin film transistor 6. FIG. 1 exemplarily shows the first electrode 51 of the micro LED 5 is electrically connected to the source S of the corresponding first thin film transistor 6, and specifically, it may be determined whether the source S or the drain D of the first thin film transistor 6 is electrically connected to the first electrode 51 of the micro LED 5 according to whether the first thin film transistor 6 is a P-type thin film transistor or an N-type thin film transistor. The pixel unit 2 in which the light-emitting component 4 is the micro LED 5 further includes a metal structure 7, the metal structure 7 is disposed between the substrate 1 and the source-drain layer 61, and the source S or the drain D of the first thin film transistor 6 electrically connected to the first electrode 51 of the micro LED 5 is electrically connected to the metal structure 7.

Specifically, combining with FIGS. 1 and 2, the driving circuit 3 is disposed between the substrate 1 and the light-emitting component 4, the driving circuit 3 is used for driving the light-emitting component 4 to emit light, and for the pixel unit 2 in which the light-emitting component 4 is the micro LED 5, the driving circuit 3 is used for driving the micro LED 5 to emit light. The driving circuit 3 may include a plurality of thin film transistors. The first thin film transistor 6 of the embodiment of the present disclosure may be a driving transistor, a source S or a drain D of the driving transistor is electrically connected to the first electrode 51 of the micro LED 5, and a driving current is supplied to the corresponding micro LED 5 to cause the micro LED 5 to emit light, and the display panel implements a display function. Exemplarily, the first electrode 51 of the micro LED 5 may be a positive electrode or a negative electrode of the micro LED 5.

It should be noted that the above-mentioned embodiment will merely be described by taking the first thin film transistor 6 as the driving transistor as an example. The first thin film transistor 6 is not limited to the driving transistor. The first thin film transistor 6 may be determined according to the connection relationship of the thin film transistors in the different driving circuits 3, to ensure that the source S or the drain D of the first thin film transistor 6 is electrically connected to the first electrode 51 of the micro LED 5.

In the embodiments of the present disclosure, the pixel unit 2 in which the light-emitting component 4 is the micro LED 5 further includes a metal structure 7. The metal structure 7 is disposed between the substrate 1 and the source-drain layer 61, and the source S or the drain D of the first thin film transistor 6 electrically connected to the first electrode 51 of the micro LED 5 is electrically connected to the metal structure 7. That is, the first electrode 51 of the micro LED 5 is electrically connected to the source S or the drain D of the corresponding first thin film transistor 6, and the source S or the drain D of the first thin film transistor 6 electrically connected to the first electrode 51 of the micro LED 5 is also electrically connected to the metal structure 7, so that a heat dissipation branch of the micro LED 5 is formed from the first electrode 51 of the micro LED 5 to the source S or the drain D of the first thin film transistor 6 electrically connected to the first electrode 51 of the micro LED 5 to the metal structure 7, and heat generated by the micro LED 5 is conducted to one side of the source-drain layer 61 facing away from the micro LED 5, thereby improving the problem that the light-emitting efficiency of the micro LED is reduced and that a service life of the micro LED is reduced since defects of the micro LED caused by an increase in temperature invade the light-emitting region of the micro LED.

Exemplarily, the light-emitting components 4 in each pixel unit 2 in the display panel may be set to be the micro LED 5s, and the driving circuits 3 disposed between the substrate 1 and the micro LED 5s are in one-to-one correspondence with the micro LED 5s, and the driving circuit 3 drives the corresponding micro LED 5 to emit light, so that the display panel implements the display function. Alternatively, as shown in FIG. 1, the light-emitting components 4 in some pixel units 21 in the display panel are set to be the micro LED 5s, the light-emitting components 4 in some pixel units 22 are organic light-emitting components. For example, in a region AA2 where the pixel unit 22 is disposed in which the light-emitting component 4 in the display panel is the organic light-emitting component, normal display is performed, and in a region AA1 where the pixel unit 21 is disposed in which the light-emitting component 4 in the display panel is the micro LED 5, the corresponding display function is implemented and additionally optical electronic components such as a front-facing camera, an optical sensor, and a fingerprint identification chip may be provided on the lower side of the display panel. Since a size of the micro LED 5 is much smaller than a size of a conventional organic light-emitting component, a high-transmittance light transmitting region having a larger area may be reserved in the display region AA1 provided with the micro LED 5 by using the micro LED 5 compared with the organic light-emitting component, and the optical electronic component may collect a light signal through the light transmitting region in the display region AA1 provided with the micro LED 5. In this way, the optical electronic components such as the front-facing camera, the optical sensor, and the fingerprint identification chip are retained while a structural integrity of the display panel and an integrity of a display image are ensured, and the integration of the optical electronic components may be achieved without providing a hollowed-out region on the display panel, thereby avoiding the problem which is caused by providing the hollowed-out region on the display panel and that an area of the display region of the display panel is reduced.

Exemplarily, a region provided with the micro LED 5 may be a notch region of a screen with a notch, as shown in FIG. 1, or the region provided with the micro LED 5 may be disposed at the top or the bottom of the display region AA. Shapes, the number, and positions of regions provided with the micro LED 5 in the display panel are not limited in embodiments of the present disclosure.

Optionally, combining with FIGS. 1 and 2, in a direction perpendicular to the substrate 1, a position a1 where the source S or the drain D of the first thin film transistor 6 electrically connected to the first electrode 51 of the micro LED 5 is electrically connected to an active layer 62 does not overlap with a position a2 where the source S or the drain D of the first thin film transistor 6 electrically connected to the first electrode 51 of the micro LED 5 is electrically connected to the metal structure 7.

Specifically, as shown in FIG. 1, in the embodiments of the present disclosure compared with the related art, the metal structure 7 is newly added at the position a1 not overlapping, along the direction perpendicular to the substrate 1, with the position a2 where the source S or the drain D of the first thin film transistor 6 electrically connected to the first electrode 51 of the micro LED 5 is electrically connected to the active layer 62, and the source S or the drain D of the first thin film transistor 6 electrically connected to the first electrode 51 of the micro LED 5 is electrically connected to the metal structure 7 so that a heat dissipation structure electrically connected to the first electrode 51 of the micro LED 5 is added, and thereby the area of the heat dissipation structure for achieving heat dissipation of the micro LED 5 is increased, a temperature of the micro LED 5 is effectively reduced thereby improving the problem that the light-emitting efficiency of the micro LED 5 is reduced and that a service life of the micro LED 5 is reduced since defects of the micro LED 5 caused by an increase in temperature invade a light-emitting region of the micro LED 5.

Combining with FIGS. 1 and 2, the driving circuit 3 further includes a capacitance structure 8. The capacitance structure 8 includes a first electrode plate 81 and a second electrode plate 82 disposed opposite to the first electrode plate 81, and the capacitance structure 8 is configured for maintaining a gate G potential of a driving transistor in the driving circuit 3. Exemplarily, the driving circuit 3 may be provided as a driving circuit 3 of a 2T1C structure, that is, the driving circuit 3 includes two thin film transistors and one capacitance structure 8, and the two thin film transistors are a driving transistor and a switch transistor, respectively. One end of the capacitance structure 8 is electrically connected to a gate G of the driving transistor in the driving circuit 3, and the capacitance structure 8 is used for maintaining the gate G potential of the driving transistor so that adjustment of the luminance of the micro LED 5 may be achieved by adjusting a data signal transmitted to the gate G of the driving transistor via the switch thin film transistor. It should be noted that the number of thin film transistors and the number of capacitors in the driving circuit 3 are not limited in the embodiments of the present disclosure.

Combining with FIGS. 1 and 2, the metal structure 7 may be disposed in at least two metal layers, an insulating layer 9 is provided between two adjacent metal layers, and the two adjacent metal layers are electrically connected to each other through the insulating layer 9 disposed between the two adjacent metal layers, for example through a via hole 70 in the insulating layer 92. The metal structure 7 is disposed in the same layer as at least two of the first electrode plate 81, the second electrode plate 82, or the gate G of the first thin film transistor 6, respectively. FIG. 1 exemplarily shows the metal structure 7 is disposed in two metal layers, the metal structure 7 is manufactured in the same layer as the first electrode plate 81 and the second electrode plate 82 of the capacitance structure 8, respectively, and the first electrode plate 81 of the capacitance structure 8 is manufactured in the same layer as the gate G of the first thin film transistor 6. Specifically, the source S or the drain D of the first thin film transistor 6 electrically connected to the first electrode 51 of the micro LED 5 is electrically connected to the portion of the metal structure 7 manufactured in the same layer as the second electrode 82 of the capacitance structure 8 through the via hole 71 disposed in the insulating layer 91, and the portion of the metal structure 7 manufactured in the same layer as the second electrode plate 82 of the capacitance structure 8 is electrically connected to the portion of the metal structure 7 manufactured in the same layer as the first electrode plate 81 of the capacitance structure 8 through the via hole 70 disposed in the insulating layer 92. In this way, the source S or the drain D of the first thin film transistor 6 electrically connected to the first electrode 51 of the micro LED 5 and the metal structure 7 electrically connected to the first electrode 51 of the micro LED 5 are used as a heat dissipation structure of the micro LED 5, so the manufacturing process of the display panel is simplified while a temperature of the micro LED 5 is effectively reduced.

FIG. 2 merely and exemplarily shows that the metal structure 7 is manufactured in the same layer as the first electrode plate 81 of the capacitance structure 8 and the second electrode plate 82 of the capacitance structure 8, respectively, and the first electrode plate 81 of the capacitance structure 8 is manufactured in the same layer as the gate G of the first thin film transistor 6, and the first electrode plate 81 of the capacitance structure 8 and the second electrode plate 82 of the capacitance structure 8 may also be disposed in different layers from the gate G of the first thin film transistor 6. In addition, the metal structure 7 may be disposed in two metal layers and is disposed in the same layer as the first electrode plate 81 and the second electrode plate 82, respectively, or the metal structure 7 is disposed in two metal layers and is manufactured in the same layer as the first electrode plate 81 and the gate G of the first thin film transistor 6, respectively, or the metal structure 7 is disposed in two metal layers and is manufactured in the same layer as the second electrode plate 82 and the gate G of the first thin film transistor 6, respectively, or the metal structure 7 is disposed in three metal layers and is manufactured in the same layer as the first electrode plate 81, the second electrode plate 82 and the gate G of the first thin film transistor 6, respectively. It is ensured that the source S or the drain D of the first thin film transistor 6 electrically connected to the first electrode 51 of the micro LED 5 and the portion of the metal structure 7 disposed in each metal layer are electrically connected in each case.

Figure 3:
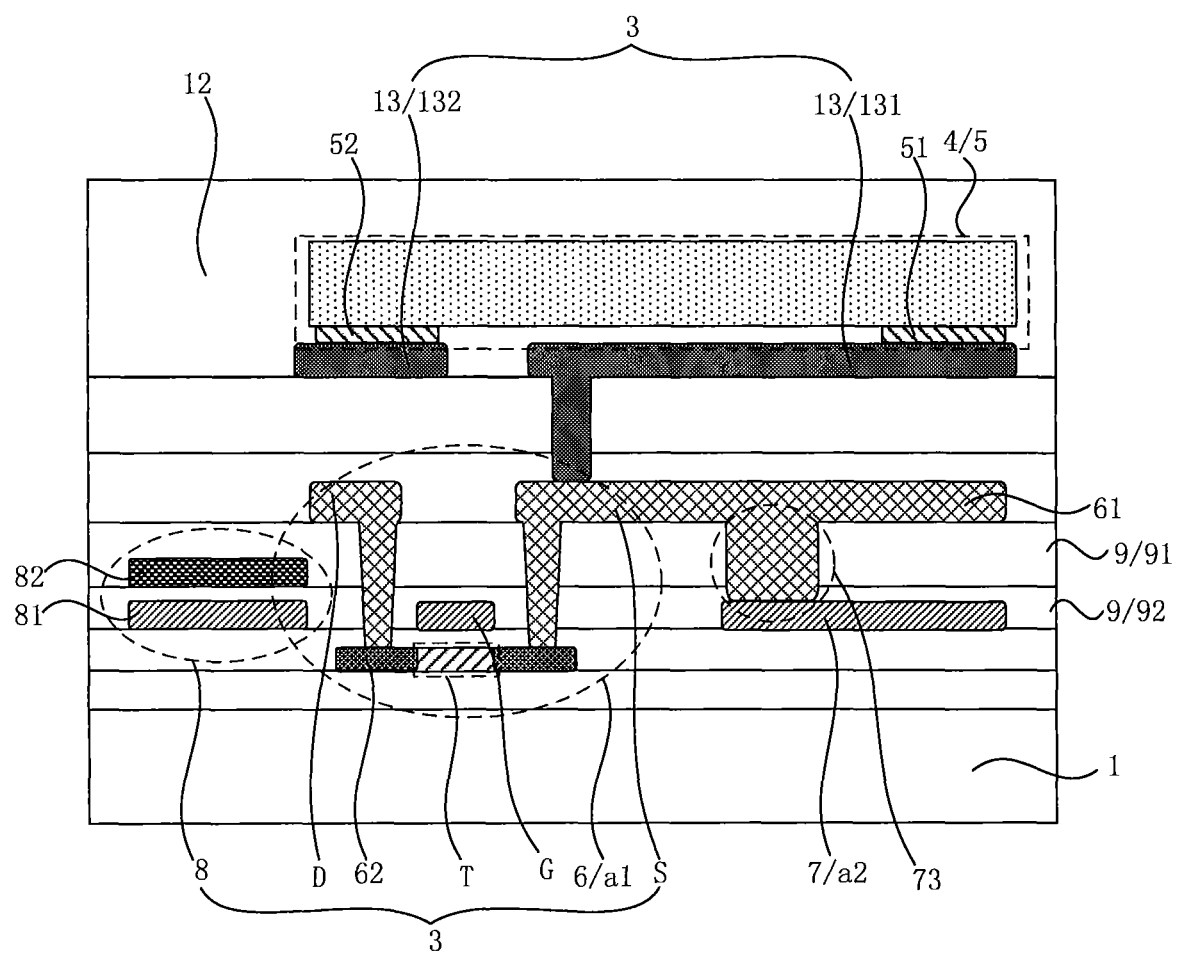
FIG. 3 is another cross-sectional view of the display panel shown in FIG. 1 along the section line A-A'.

FIG. 3 is another cross-sectional view of the display panel shown in FIG. 1 along the section line A-A'. As shown in FIG. 3, the metal structure 7 may be disposed in one metal layer and is manufactured in the same layer as any one of the first electrode plate 81, the second electrode plate 82 or the gate G of the first thin film transistor 6. FIG. 3 exemplarily shows that the metal structure 7 is disposed in one metal layer and is manufactured in the same layer as the gate G of the first thin film transistor 6. Specifically, as shown in FIG. 3, the source S or the drain D of the first thin film transistor 6 electrically connected to the first electrode 51 of the micro LED 5 is electrically connected to the portion of the metal structure 7 manufactured in the same layer as the gate G of the first thin film transistor 6 through the via hole 73 disposed in the insulating layer 91 and the insulating layer 92. In this way, the source S or the drain D of the first thin film transistor 6 electrically connected to the first electrode 51 of the micro LED 5 and the metal structure 7 electrically connected to the first electrode 51 of the micro LED 5 are used as the heat dissipation structure of the micro LED 5, so the manufacturing process of the display panel is simplified while a temperature of the micro LED 5 is effectively reduced.

Exemplarily, the metal structure 7 may be disposed in one metal layer and is manufactured in the same layer as the first electrode plate 81, or the metal structure 7 is disposed in one metal layer and is manufactured in the same layer as the second electrode plate 82. Similarly, the first electrode plate 81 of the capacitance structure 8 may be manufactured in the same layer as the gate G of the first thin film transistor 6 as shown in FIG. 3, and the first electrode plate 81 of the capacitance structure 8 and the second electrode plate 82 of the capacitance structure 8 may also be disposed in different layers from the gate G of the first thin film transistor 6.

Figure 4:
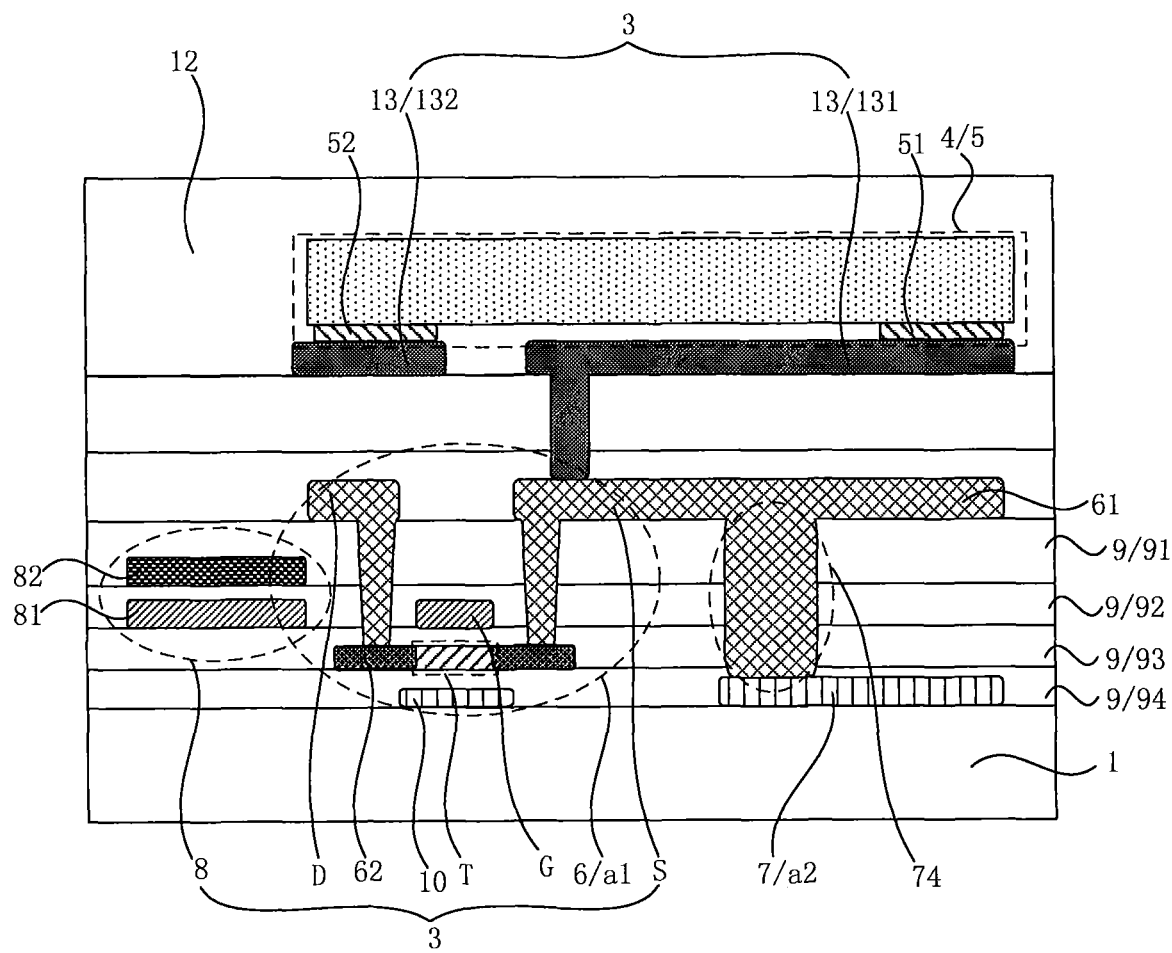
FIG. 4 is another cross-sectional view of the display panel shown in FIG. 1 along the section line A-A'.

FIG. 4 is another cross-sectional view of the display panel shown in FIG. 1 along the section line A-A'. On the basis of the above-mentioned embodiments, in the display panel having the structure shown in FIG. 4, the pixel unit 2 in which the light-emitting component 4 is the micro LED 5 further includes a light shielding structure 10 disposed between an active layer 62 of the first thin film transistor 6 and the substrate 1, and a vertical projection of the light shielding structure 10 on the substrate 1 covers a vertical projection of a channel region T of a corresponding active layer 62 on the substrate 1.

Specifically, as shown in FIG. 4, the source S and the drain D of the thin film transistor 6 are electrically connected to the active layer 62 of the first thin film transistor 6, a portion of the active layer 62 corresponding to the gate G is the channel region T of the active layer 62 of the first thin film transistor 6, and irradiation of light to the channel region T of the first thin film transistor 6 causes the first thin film transistor 6 to generate photo-generated carriers to affect a switching characteristic of the first thin film transistor 6. Therefore the light shielding structure 10 may be provided in the display panel, and the vertical projection of the light shielding structure 10 on the substrate 1 covers the vertical projection of the channel region T of the corresponding active layer 62 on the substrate 1, thereby effectively preventing light from irradiating the channel region T of the first thin film transistor 6 so that the first thin film transistor 6 generates the photo-generated carriers to affect the switching characteristic of the first thin film transistor 6.

The metal structure 7 may be disposed in one metal layer and is manufactured in the same layer as any one of the first electrode plate 81, the second electrode plate 82, the gate G of the first thin film transistor, or the light shielding structure 10. FIG. 4 exemplarily shows that the metal structure 7 is disposed in one metal layer and is manufactured in the same layer as the light shielding structure 10. Specifically, as shown in FIG. 4, the source S or the drain D of the first thin film transistor 6 electrically connected to the first electrode 51 of the micro LED 5 is electrically connected to the portion of the metal structure 7 manufactured in the same layer as the light shielding structure 10 through the via hole 74 disposed in the insulating layer 91, the insulating layer 92, the insulating layer 93 and the insulating layer 94. In this way, the source S or the drain D of the first thin film transistor 6 electrically connected to the first electrode 51 of the micro LED 5 and the metal structure 7 electrically connected to the first electrode 51 of the micro LED 5 are used as a heat dissipation structure of the micro LED 5, so the manufacturing process of the display panel is simplified while a temperature of the micro LED 5 is effectively reduced.

Exemplarily, the metal structure 7 may also be disposed in at least two metal layers, an insulating layer 9 is provided between adjacent two metal layers, and the adjacent two metal layers are electrically connected through the via hole disposed in the insulating layer 9 between the adjacent two metal layers, with the metal structure 7 being disposed in the same layer as at least two of the first electrode plate 81, the second electrode plate 82, the gate G of the first thin film transistor 6, or the light shielding structure 10, respectively. For example, the metal structure 7 may be disposed in two metal layers and is manufactured in the same layer as any two of the first electrode plate 81, the second electrode plate 82, the gate G of the first thin film transistor 6, or the light shielding structure 10, respectively, the metal structure 7 may also be disposed in three metal layers and is manufactured in the same layer as any three of the first electrode plate 81, the second electrode plate 82, the gate G of the first thin film transistor 6, or the light shielding structure 10, respectively, and the metal structure 7 may also be disposed in four metal layers and is manufactured in the same layer as the first electrode plate 81, the second electrode plate 82, the gate G of the first thin film transistor 6, or the light shielding structure 10, respectively. An extension manner of the specific arrangement of the metal structure 7 is similar to the extension manner of the metal structure 7 in the display panel having the structure shown in FIGS. 2 and 3, and is not intended to be exhaustive here. Similarly, it is ensured that the source S or the drain D of the first thin film transistor 6 electrically connected to the first electrode 51 of the micro LED 5 and the portion of the metal structure 7 disposed in each metal layer are electrically connected in each case.

Figure 5:
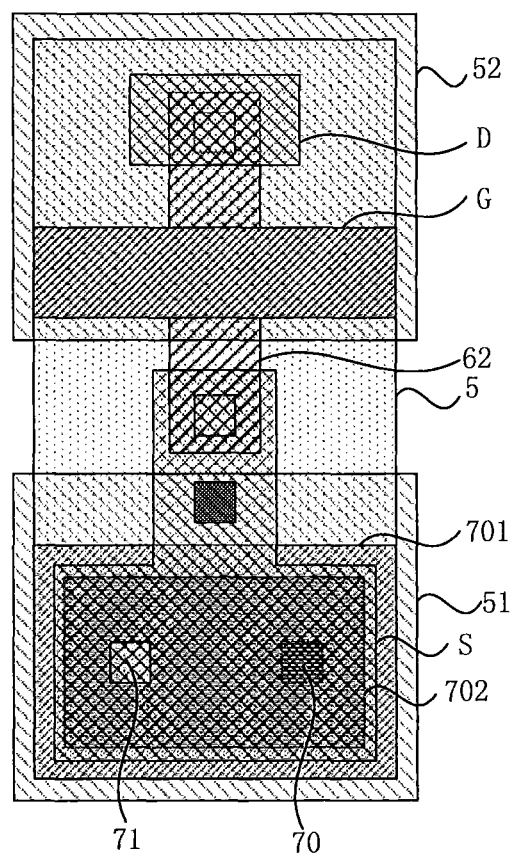
FIG. 5 is a top view of another display panel according to an embodiment of the present disclosure.
Figure 6:
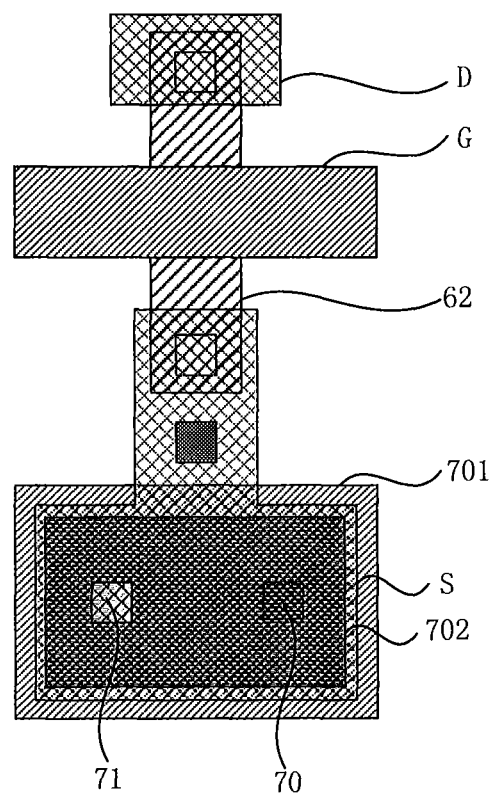
FIG. 6 is a top view of another display panel according to an embodiment of the present disclosure.

FIG. 5 is a top view of another display panel according to an embodiment of the present disclosure, and FIG. 6 is a top view of another display panel according to an embodiment of the present disclosure. Combining with FIGS. 1, 2, 5 and 6, the vertical projection of the micro LED 5 on the substrate 1 may cover the vertical projection of the metal structure 7 on the substrate 1 and the vertical projection of the source S or the drain D of the first thin film transistor 6 electrically connected to the first electrode 51 of the micro LED 5 on the substrate 1. In other words, a vertical projection formed by an LED semiconductor structure in the micro LED 5, the first electrode 51 and the second electrode 52 covers the vertical projection of the metal structure 7 and the vertical projection of the source S or the drain D of the first thin film transistor 6 electrically connected to the first electrode 51 of the micro LED 5 on the substrate 1.

Specifically, the metal structure 7 and the source S or the drain D of the first thin film transistor 6 electrically connected to the first electrode 51 of the micro LED 5 are light-opaque structures. The vertical projection of the micro LED 5 on the substrate 1 covers the vertical projection of the metal structure 7 on the substrate 1 and the vertical projection of the source S or the drain D of the first thin film transistor 6 electrically connected to the first electrode 51 of the micro LED 5 on the substrate 1, so that the influence of the metal structure 7 and the source S or the drain D of the first thin film transistor 6 electrically connected to the first electrode 51 of the micro LED 5 on the aperture ratio of the display panel AA1 provided with the micro LED 5 is reduced while the temperature of the micro LED 5 is effectively reduced by using the source S or the drain D of the first thin film transistor 6 electrically connected to the first electrode 51 of the micro LED 5 and the metal structure 7 electrically connected to the first electrode 51 of the micro LED 5 as the heat dissipation structure of the micro LED 5.

It should be noted that FIGS. 5 and 6 merely and exemplarily show the source S or the drain D of the first thin film transistor 6 electrically connected to the first electrode 51 of the micro LED 5, the portion 701 of the metal structure 7 disposed in the same layer as the first electrode plate 81 of the capacitance structure 8, and the portion 702 of the metal structure 7 disposed in the same layer as the second electrode plate 82 of the capacitance structure 8. Embodiments of the present disclosure do not limit magnitude relationships and coverage conditions of the vertical projections of the source S or the drain D of the first thin film transistor 6 electrically connected to the first electrode 51 of the micro LED 5, the portion 701 of the metal structure 7 disposed in the same layer as the first electrode plate 81 of the capacitance structure 8 and the portion 702 of the metal structure 7 disposed in the same layer as the second electrode plate 82 of the capacitance structure 8. It is only ensured that the vertical projection of the micro LED 5 on the substrate 1 covers the vertical projection of the metal structure 7 on the substrate 1 and the vertical projection of the source S or the drain D of the first thin film transistor 6 electrically connected to the first electrode 51 of the micro LED 5 on the substrate 1.

Figure 7:
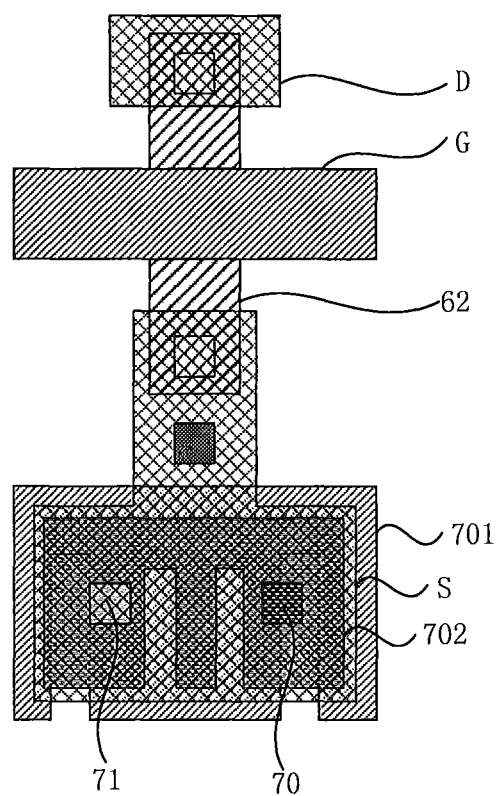
FIG. 7 is a top view of another display panel according to an embodiment of the present disclosure.
Figure 8:
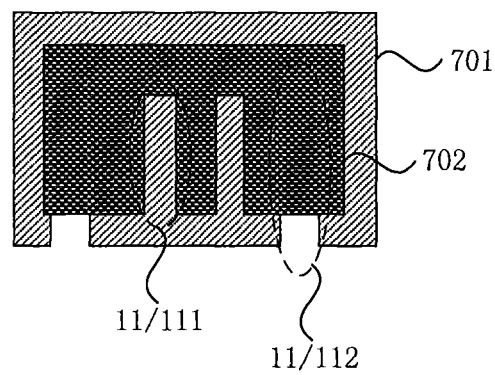
FIG. 8 is a top view of another display panel according to an embodiment of the present disclosure.

FIG. 7 is a top view of another display panel according to an embodiment of the present disclosure, and FIG. 8 is a top view of another display panel according to an embodiment of the present disclosure. Combining with FIGS. 2 to 4, 7 and 8, in a plane parallel to the substrate 1, at least one of the source S or the drain D of the first thin film transistor 6 electrically connected to the first electrode 51 of the micro LED 5 or the portion of the metal structure 7 disposed in at least one metal layer may include at least one gap 11.

Specifically, taking the display panel having the structure shown in FIG. 2 as an example, and combining with FIGS. 2, 7 and 8, exemplarily the portion of the metal structure 7 disposed in at least one metal layer includes at least one gap 11. For example, the metal structure 7 is disposed in two metal layers, and in the plane parallel to the substrate 1, a portion 701 and a portion 702 of the metal structure 7 which are disposed in two metal layers each include a plurality of gaps 11, and for example, a portion 701 of the metal structure 7 disposed in one metal layer includes two gap structures 111, and a portion 702 of the metal structure 7 disposed in one metal layer includes two gap structures 112.

Exemplarily, the source S or the drain D of the first thin film transistor 6 electrically connected to the first electrode 51 of the micro LED 5 may also include at least one gap 11 in the plane parallel to the substrate 1, and the source S or the drain D of the first thin film transistor 6 electrically connected to the first electrode 51 of the micro LED 5 and the portion of the metal structure 7 disposed in at least one metal layer each may include at least one gap 11 in the plane parallel to the substrate 1. In this way, the gap 11 is disposed, facilitating an increase in the heat dissipation area of the heat dissipation structure, i.e., the source S or the drain D of the first thin film transistor 6 electrically connected to the first electrode 51 of the micro LED 5 and the metal structure 7, of the micro LED 5 by using the surface area of the gap 11, thereby further reducing the temperature of the micro LED 5, and improving the problem that the light-emitting efficiency of the micro LED 5 is reduced and that the service life of the micro LED 5 is reduced since defects of the micro LED 5 caused by an increase in temperature invade the light-emitting region of the micro LED 5.

Exemplarily, combining with FIGS. 2 to 4, 7 and 8, at least one of the source S or the drain D of the first thin film transistor 6 electrically connected to the first electrode 51 of the micro LED 5 and the portion of the metal structure 7 disposed in at least one metal layer may be E-shaped in the plane parallel to the substrate 1. FIGS. 7 and 8 exemplarily show that the metal structure 7 is disposed in two metal layers, and that the portions of the metal structure 7 disposed in two metal layers each are E-shaped in the plane parallel to the substrate 1.

Figure 9:
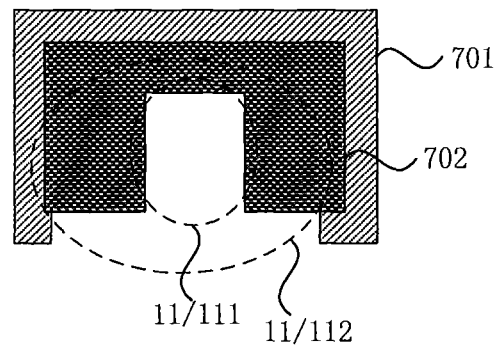
FIG. 9 is a top view of another display panel according to an embodiment of the present disclosure.

FIG. 9 is a top view of another display panel according to an embodiment of the present disclosure. Unlike the display panel having the structure shown in FIGS. 7 and 8, the display panel having the structure shown in FIG. 9 is disposed in the plane parallel to the substrate 1, and at least one of the source S or the drain D of the first thin film transistor 6 electrically connected to the first electrode 51 of the micro LED 5 or the portion of the metal structure 7 disposed in at least one metal layer is U-shaped. FIG. 9 exemplarily shows that the metal structure 7 is disposed in two metal layers, and that the portions of the metal structure 9 disposed in two metal layers are E-shaped in the plane parallel to the substrate 1.

Specifically, combining with FIGS. 7 to 9, at least one of the source S or the drain D of the first thin film transistor 6 electrically connected to the first electrode 51 of the micro LED 5 or the portion of the metal structure 7 disposed in at least one metal layer is E-shaped or U-shaped in the plane parallel to the substrate 1, facilitating an increase in the heat dissipation area of the heat dissipation structure, i.e., the source S or the drain D of the first thin film transistor 6 electrically connected to the first electrode 51 of the micro LED 5 and the metal structure 7, of the micro LED 5 by using the surface area of the gap 11, so that in the plane parallel to the substrate 1, at least one of the source S or the drain D of the first thin film transistor 6 electrically connected to the first electrode 51 of the micro LED 5 or the portion of the metal structure 7 disposed in at least one metal layer is in a divergent shape while the temperature of the micro LED 5 is further reduced, which is beneficial for improving the heat dissipation effect of at least one of the source S or the drain D of the first thin film transistor 6 electrically connected to the first electrode 51 of the micro LED 5 or the portion of the metal structure 7 disposed in at least one metal layer to further reduce the temperature of the micro LED 5.

It should be noted that the above-mentioned embodiment is only described by taking at least one of the source S or the drain D of the first thin film transistor 6 electrically connected to the first electrode 51 of the micro LED 5 or the portion of the metal structure 7 disposed in at least one metal layer being E-shaped or U-shaped in the plane parallel to the substrate 1 as an example. Embodiments of the present disclosure do not limit the specific shape of at least one of the source S or the drain D of the first thin film transistor 6 electrically connected to the first electrode 51 of the micro LED 5 or the portion of the metal structure 7 disposed in at least one metal layer in the plane parallel to the substrate 1. In addition, the embodiments of the present disclosure do not limit the positions of the gaps in the heat dissipation structures disposed in different layers and the upper-lower correspondence relationship of the gaps in the heat dissipation structures disposed in different layers.

Optionally, combining with FIGS. 2 to 4, and the micro LED 5 may further include the LED semiconductor structure. The LED semiconductor structure may include a first-type semiconductor layer, an active layer, and a second-type semiconductor layer, which are stacked from top to bottom. In the embodiment, the specific material and structure of the micro LED 5 structure are not limited, that is, the materials of the first-type semiconductor layer, the active layer, and the second-type semiconductor layer are not limited, and different materials may be selected according to the light-emitting colors of different micro LEDs 5.

Exemplarily, the micro LED 5 may be a micro LED having the same-side electrode structure, the first electrode 51 and the second electrode 52 are disposed on the same side of the LED semiconductor structure, and it should be noted that in the manufacturing process of the first electrode 51 and the second electrode 52, the first electrode 51 is disposed on a surface of the first-type semiconductor layer facing away from the active layer and etches the first-type semiconductor layer and the active layer to expose part of the second-type semiconductor layer, and then the second electrode 52 is manufactured on a surface of the second-type semiconductor layer facing towards the active layer, and finally a micro LED structure having the same-side electrode structure is formed. Specifically, combining with FIGS. 1 to 4, for the pixel unit 2 in which the light-emitting component 4 is the micro LED 5, the driving circuit 3 may be formed first, that is, the first thin film transistor 6, the capacitance structure 8, and other thin film transistors in the driving circuit 3 are formed, and then driving signal lines 13 electrically connected to the first electrode 51 of the micro LED 5 and the second electrode 52 of the micro LED 5, respectively, are formed. A driving signal line 131 is electrically connected to the source S or the drain D of the corresponding first thin film transistor 6, a driving signal line 132 may be electrically connected to the driving chip in the display panel directly, and then the micro LED 5 is transferred to a corresponding position so that the first electrode 51 of the micro LED 5 is electrically connected to the driving signal line 131, the second electrode 52 of the micro LED 5 is electrically connected to the driving signal line 132, and a first driving signal line 1351 and a second driving signal line 1352 provide a light-emitting voltage signal to the micro LED 5.

Optionally, combining with FIGS. 2 to 4, the display panel may further include a protective layer 12, the protective layer 12 is disposed on one side of the micro LED 5 facing away from the substrate 1, the protective layer 12 covers the micro LED 5, and the planarization degree of the surface of the display panel is increased while the protective layer 12 is used to protect the micro LED 5. Exemplarity, the material constituting the protective layer 12 may include glass or polyimide.

Figure 10:
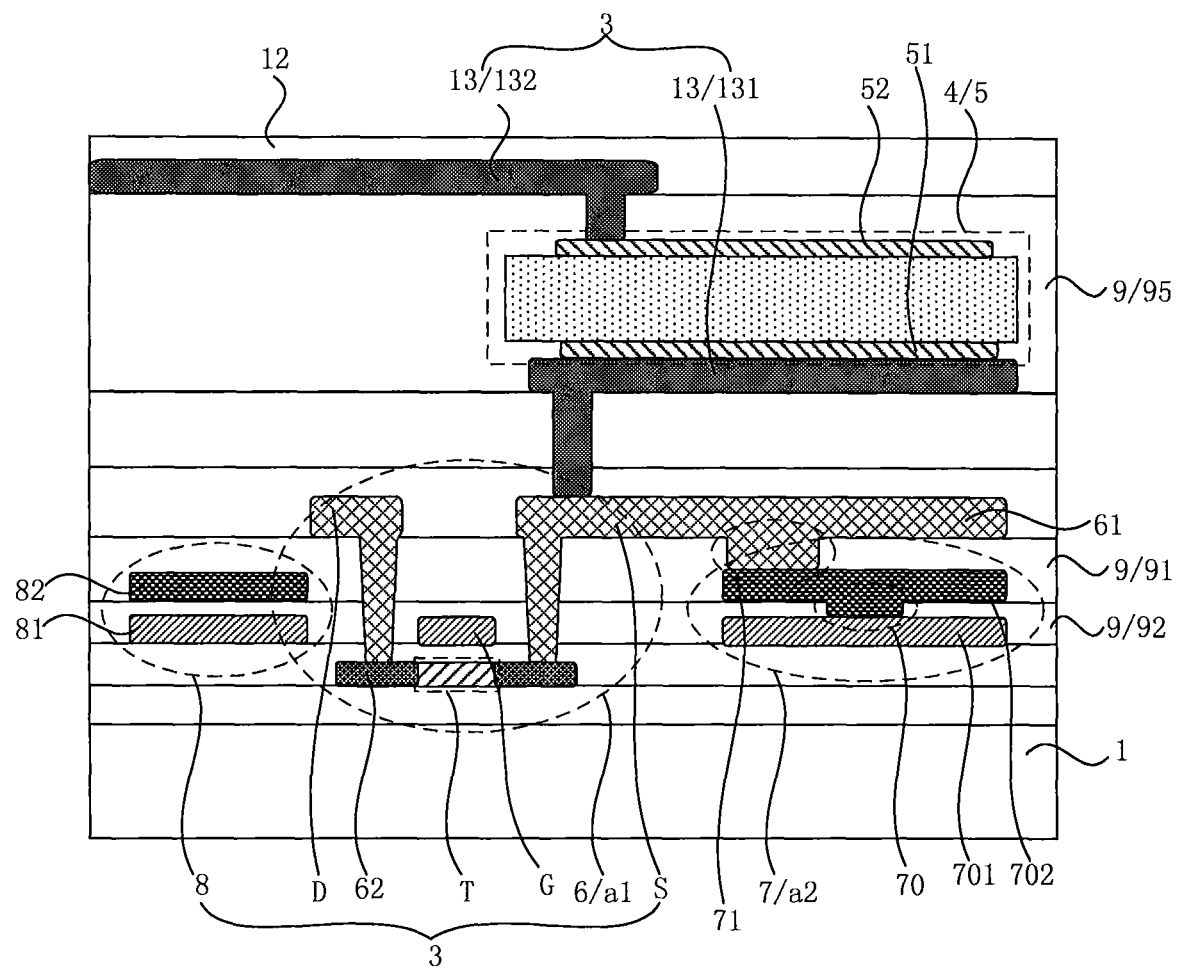
FIG. 10 is another cross-sectional view of the display panel shown in FIG. 1 along the section line A-A'.

FIG. 10 is a cross-sectional view of another display panel according to an embodiment of the present disclosure. Unlike the display panel having the structure shown in FIG. 2, in the display panel having the structure shown in FIG. 10, in the direction perpendicular to the substrate 1, the first electrode 51 and the second electrode 52 of the micro LED 5 are disposed on two sides of the LED semiconductor structure of the micro LED 5. In other words, the micro LED having a vertical electrode structure is provided. Specifically, combining with FIGS. 1 and 10, for the pixel unit 2 in which the light-emitting component 4 is the micro LED 5, the driving circuit 3 may be formed first, that is, the first thin film transistor 6, the capacitance structure 8, and other thin film transistors in the driving circuit 3 are formed, and then the driving signal line 131 electrically connected to the source S or the drain D of the first thin film transistor 6 is formed, when the micro LED 5 is transferred to the corresponding position, the first electrode 51 of the micro LED 5 is electrically connected to the driving signal line 131 directly, and then the driving signal line 132 is formed. As shown in FIG. 10, the driving signal line 132 is electrically connected to the second electrode 51 of the micro LED 5 through a through-hole, and the driving signal line 132 may also be electrically connected to the second electrode 52 of the micro LED 5 directly, and a first driving signal line 52 and a second driving signal line 1352 provide a light-emitting voltage signal to the micro LED 5. The foregoing two cases depend on the magnitude relationship between the height of the micro LED 5 and the thickness of the insulating layer 95, which is not limited in embodiments of the present disclosure.

Optionally, as shown in FIG. 10, the display panel further includes the protective layer 12, the protective layer 12 is disposed on one side of the micro LED 5 facing away from the substrate 1, the protective layer 12 covers the driving signal line 132 electrically connected to the second electrode 52 of the micro LED 5, and the planarization degree of the surface of the display panel is increased while the protective layer 12 is used to protect the micro LED 5 and the driving signal line 132 electrically connected to the second electrode 52 of the micro LED 5. Similarly, the material constituting the protective layer 12 may include glass or polyimide.

It should be noted that FIGS. 2 to 4 and 10 merely and exemplarily show that the first thin film transistor 6 is a thin film transistor having a top gate structure, and the first thin film transistor 6 may also be a thin film transistor having a bottom gate structure, which is not limited in the embodiments of the present disclosure. In addition, it should be noted that the drawings of the embodiments of the present disclosure merely and exemplarily denote the size of each component and the size of each film layer, and do not represent the actual size of each component or the actual size of each film layer in the display panel.

Embodiments of the present disclosure provide a display panel, the display panel includes a substrate and a plurality of pixel units disposed on the substrate, and each pixel unit includes a driving circuit and a light-emitting component. The driving circuit is disposed between the substrate and the light-emitting component, and the driving circuit is used for driving the corresponding light-emitting component to emit light. At least one light-emitting component is a micro LED. For a pixel unit in which the light-emitting component is the micro LED, the driving circuit at least includes a first thin film transistor, the source and the drain of the first thin film transistor being disposed in a source-drain layer. A first electrode of the micro LED is electrically connected to the source or the drain of the corresponding first thin film transistor. The pixel unit in which the light-emitting component is the micro LED further includes a metal structure, the metal structure is disposed between the substrate and the source-drain layer, and the source or the drain of the first thin film transistor electrically connected to the first electrode of the micro LED is electrically connected to the metal structure. In this way, the source or the drain of the first thin film transistor electrically connected to the first electrode of the micro LED and the metal structure electrically connected to the first electrode of the micro LED are used as heat dissipation structures of the micro LED so that a temperature of the micro LED is effectively reduced, thereby improving the problem that the light-emitting efficiency of the micro LED is reduced and that a service life of the micro LED is reduced since defects of the micro LED caused by an increase in temperature invade the light-emitting layer of the micro LED.

Figure 11:
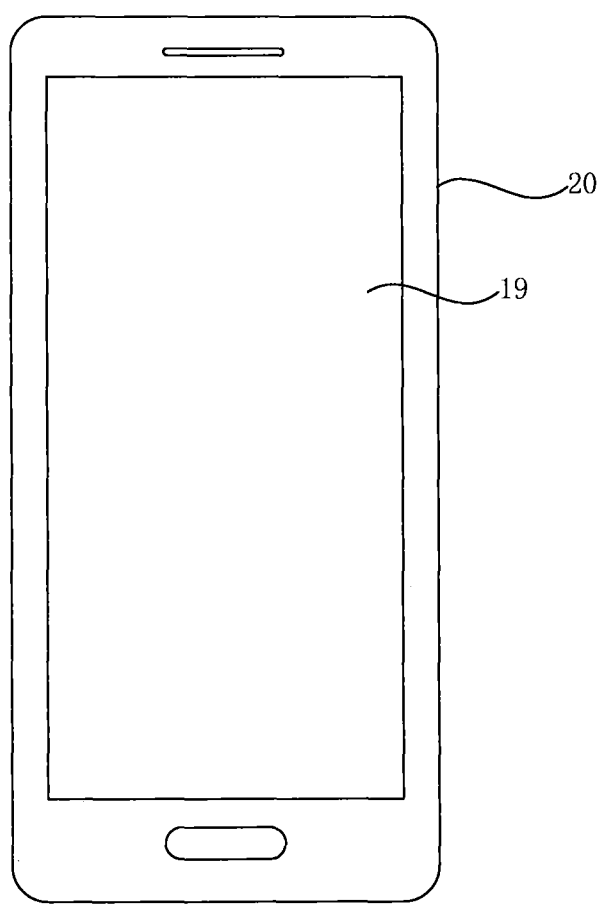
FIG. 11 is a structural diagram of a display device according to an embodiment of the present disclosure.

A display device is further provided in the embodiments of the present disclosure. FIG. 11 is a structural diagram of a display device according to an embodiment of the present disclosure. As shown in FIG. 11, a display device 20 includes the display panel 19 described in the above embodiments. Therefore, the display device 20 provided in the embodiment of the present disclosure also has the beneficial effects described in the above embodiments, and thus details are not described here again. Exemplarily, the display device 20 may be a mobile phone, a computer, a television or another electronic device.

It should be noted that the above are merely preferred embodiments of the present disclosure and the technical principles used therein. It will be understood by those skilled in the art that the present disclosure is not limited to the specific embodiments described herein. Those skilled in the art can make various apparent modifications, adaptations and substitutions without departing from the scope of the present disclosure. Therefore, while the present disclosure has been described in detail through the above-mentioned embodiments, the present disclosure is not limited to the above-mentioned embodiments and may include other equivalent embodiments without departing from the concept of the present disclosure. The scope of the present disclosure is determined by the scope of the appended claims.

What is claimed is:
1. A display panel, comprising:
   a substrate, a micro Light Emitting Diode (LED), and a driving circuit,
   wherein the micro LED and the driving circuit are disposed on a same side of the substrate, and the driving circuit is located between the micro LED and the substrate;

wherein the driving circuit comprises a first thin film transistor, an insulating layer and a metal structure, wherein a source of the first thin film transistor and a drain of the first thin film transistor are disposed in a source-drain layer, the metal structure is disposed between the substrate and the source-drain layer, the insulating layer is disposed between the source-drain layer and the metal structure, and an active layer of the first thin film transistor is disposed between the insulating layer and the substrate;

wherein the micro LED comprises a first electrode, an LED semiconductor structure and a second electrode, and the first electrode and the second electrode disposed on a same side of the LED semiconductor structure along a direction perpendicular to the substrate and are both disposed between the LED semiconductor structure and the first thin film transistor;

wherein the display panel further comprises a light shielding structure disposed between the active layer of the first thin film transistor and the substrate, the light shielding structure is overlapped with the active layer of the first thin film transistor, the light shielding structure and the metal structure are arranged in a same layer and are spaced apart from each other;

wherein the source of the first thin film transistor is electrically connected to the first electrode of the micro LED, the source of the first thin film transistor is electrically connected to the active layer at a first position through a first connection portion penetrating through the insulating layer and is electrically connected to the metal structure at a second position through a second connection portion penetrating through the insulating layer, and the first position and the second position do not overlap; or, wherein the drain of the first thin film is electrically connected to the first electrode of the micro LED, the drain of the first thin film transistor is electrically connected to the active layer at a first position through a first connection portion penetrating through the insulating layer and is electrically connected to the metal structure at a second position through a second connection portion penetrating through the insulating layer, and the first position and the second position do not overlap; and wherein the metal structure is used as a heat dissipation structure for the micro LED.

2. The display panel according to claim 1,
wherein the driving circuit further comprises a capacitance structure, the capacitance structure comprises a first electrode plate and a second electrode plate disposed opposite to the first electrode plate, and wherein the first thin film transistor comprises a gate.

3. The display panel of claim 1, wherein the driving circuit further comprises a capacitance structure, the capacitance structure comprises a first electrode plate and a second electrode plate disposed opposite to the first electrode plate, and wherein the first thin film transistor comprises a gate;

wherein the metal structure is disposed in at least two metal layers, an insulating layer is provided between adjacent two metal layers of the at least two metal layers, and the adjacent two metal layers of the at least two metal layers are electrically connected through a via hole disposed in the insulating layer between the adjacent two metal layers of the at least two metal layers, and the metal structure is disposed in a same layer as at least two of the first electrode plate, the second electrode plate, or the gate of the first thin film transistor, respectively.

4. The display panel of claim 1, wherein the driving circuit further comprises a capacitance structure, wherein the capacitance structure comprises a first electrode plate and a second electrode plate disposed opposite to the first electrode plate, and wherein the first thin film transistor comprises a gate; and
wherein the pixel unit in which the light-emitting component is the micro LED further comprises a light shielding structure disposed between an active layer of the first thin film transistor and the substrate, and wherein the light shielding structure is overlapped with a channel region of the active layer; and wherein the metal structure is disposed in at least two metal layers, an insulating layer is provided between adjacent two metal layers of the at least two metal layers, and the adjacent two metal layers of the at least two metal layers are electrically connected through a via hole disposed in the insulating layer between the adjacent two metal layers of the at least two metal layers, and the metal structure is disposed in a same layer as at least two of the first electrode plate, the second electrode plate, the gate of the first thin film transistor, or the light shielding structure, respectively.

5. The display panel of claim 1, wherein the micro LED is overlapped with the metal structure, and the micro LED is overlapped with the source of the first thin film transistor or the drain of the first thin film transistor electrically connected to the micro LED.

6. The display panel of claim 1, wherein in a plane parallel to the substrate, at least one of the source of the first thin film transistor or the drain of the first thin film transistor electrically connected to the micro LED or a portion of the metal structure disposed in at least one metal layer comprises at least one notch.

7. The display panel of claim 1, wherein in the plane parallel to the substrate, the source of the first thin film transistor or the drain of the first thin film transistor electrically connected to the micro LED has an E-shape or U-shape.

8. The display panel of claim 1, wherein the display panel further comprises a protective layer, the protective layer is disposed on a side of the micro LED facing away from the substrate, and the micro LED is covered by the protective layer.

9. The display panel of claim 1, wherein the micro LED further comprises an LED semiconductor structure and a second electrode, and the first electrode and the second electrode are disposed on two sides of the LED semiconductor structure along a direction perpendicular to the substrate.

10. The display panel of claim 9, wherein the display panel further comprises a protective layer, the protective layer is disposed on one side of the micro LED facing away from the substrate, and a signal line electrically connected to the second electrode of the micro LED is covered by the protective layer.

11. A display device, comprising the display panel according to claim 1.

12. A display panel, comprising:
a substrate, a micro Light Emitting Diode (LED), and a driving circuit,
wherein the micro LED and the driving circuit are disposed on a same side of the substrate, and the driving circuit is located between the micro LED and the substrate;
wherein the driving circuit comprises a first thin film transistor, an insulating layer and a metal structure, wherein a source of the first thin film transistor and a drain of the first thin film transistor are disposed in a source-drain layer, the metal structure is disposed between the substrate and the source-drain layer, the insulating layer is disposed between the source-drain layer and the metal structure, and an active layer of the first thin film transistor is disposed between the insulating layer and the substrate;

wherein the micro LED comprises a first electrode, an LED semiconductor structure and a second electrode, and the first electrode and the second electrode are disposed on a same side of the LED semiconductor structure along a direction perpendicular to the substrate and are both disposed between the LED semiconductor structure and the first thin film transistor;

wherein the display panel further comprises a light shielding structure disposed between an active layer of the first thin film transistor and the substrate, the light shielding structure is overlapped with the active layer of the first thin film transistor, the light shielding structure and the metal structure are arranged in a same layer and are spaced apart from each other;

wherein the source of the first thin film transistor is electrically connected to the first electrode of the micro LED, the source of the first thin film transistor is electrically connected to the active layer at a first position through a first connection portion penetrating through the insulating layer and is electrically connected to the metal structure at a second position through a second connection portion penetrating through the insulating layer, and the first position and the second position do not overlap; or, wherein the drain of the first thin film is electrically connected to the first electrode of the micro LED, the drain of the first thin film transistor is electrically connected to the active layer at a first position through a first connection portion penetrating through the insulating layer and is electrically connected to the metal structure at a second position through a second connection portion penetrating through the insulating layer, and the first position and the second position do not overlap; and wherein the metal structure has an E-shape or U-shape.

13. The display panel according to claim 1, wherein the driving circuit further comprises a capacitance structure, the capacitance structure comprises a first electrode plate and a second electrode plate disposed opposite to the first electrode plate, and wherein the first thin film transistor comprises a gate.

14. The display panel of claim 12, wherein the micro LED is overlapped with the metal structure, and the micro LED is overlapped with the source of the first thin film transistor or the drain of the first thin film transistor electrically connected to the micro LED.

15. The display panel of claim 12, wherein the display panel further comprises a protective layer, the protective layer is disposed on a side of the micro LED facing away from the substrate, and the micro LED is covered by the protective layer.

* * * * *